(12) United States Patent
Ferrant et al.

(10) Patent No.: US 7,180,160 B2
(45) Date of Patent: Feb. 20, 2007

(54) MRAM STORAGE DEVICE

(75) Inventors: Richard Ferrant, Esquibien (FR); Daniel Braun, Paris (FR); Pascal Louis, Longjumeau (FR)

(73) Assignees: Infineon Technologies AG, Munich (DE); Altis Semiconductor, Corbeil Essonnes Cedex (FR)

( * ) Notice: Subject to any disclaimer, the term of this patent is extended or adjusted under 35 U.S.C. 154(b) by 0 days.

(21) Appl. No.: 10/903,722

(22) Filed: Jul. 30, 2004

(65) Prior Publication Data

US 2006/0024886 A1 Feb. 2, 2006

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/618; 257/296; 257/306; 257/307; 257/308

(58) Field of Classification Search ................ 257/618, 257/296, 306–308
See application file for complete search history.

(56) References Cited

U.S. PATENT DOCUMENTS

| 5,640,343 | A | 6/1997 | Gallagher et al. |
| 5,838,608 | A | 11/1998 | Zhu et al. |
| 6,522,573 | B2 | 2/2003 | Saito et al. |
| 6,731,535 | B1 | 5/2004 | Ooishi et al. |
| 2002/0141231 | A1 | 10/2002 | Xomori |
| 2003/0185038 | A1 | 10/2003 | Sharma et al. |
| 2005/0073879 | A1* | 4/2005 | Gogl et al. ................. 365/158 |
| 2005/0135149 | A1* | 6/2005 | Hung et al. ................. 365/171 |
| 2006/0056250 | A1* | 3/2006 | Miura et al. ................. 365/202 |

FOREIGN PATENT DOCUMENTS

| DE | 695 27 827 | 4/2003 |
| WO | WO 03/092076 | 11/2003 |

* cited by examiner

*Primary Examiner*—Jerome Jackson
*Assistant Examiner*—Jesse A. Fenty
(74) *Attorney, Agent, or Firm*—Dicke, Billig & Czaja, PLLC

(57) ABSTRACT

A MRAM storage device comprises a substrate, on/above of which a plurality of word lines, a plurality of bit lines, a plurality of memory cells, and a plurality of isolation diodes are provided. Each memory cell forms a resistive cross point of one word line and one bit line, respectively. Each memory cell is connected to one isolation diode such that a unidirectional conductive path is formed from a word line to a bit line via the corresponding memory cell, respectively. The substrate, at least a part of the word lines or at least a part of the bit lines, and the isolation diodes are realized as one common monocrystal semiconductor block.

18 Claims, 5 Drawing Sheets

MRAM STORAGE DEVICE

BACKGROUND

The present invention relates generally to random access memory for data storage. More specifically, the present invention relates to a magnetic random access memory device that includes improved unidirectional elements to limit leakage current within the array.

Magnetic random access memory (MRAM) is a non-volatile memory that shows considerable promise for long-term data storage. Performing read and write operations on MRAM devices are much faster than performing read and write operations on conventional memory devices such as DRAM and flash and order of magnitude faster than long-term storage device such as hard drives. In addition, the MRAM devices are more compact and consume less power than other conventional storage devices.

A typical MRAM device includes an array of memory cells. Word lines extend across rows of the memory cells and bit lines extend along columns of the memory cells. Each memory cell is located at a cross point of a word line and a bit line.

A memory cell stores a bit of information as an orientation of magnetization. The magnetization of each memory cell assumes one of two stable orientations at any given time. These two stable orientations, parallel and anti-parallel, represent logic values of "0" and "1".

The magnetization orientation effects the resistance of a memory cell such as a spin-tunnelling device. For instance, resistance of a memory cell is a first value R if the magnetization orientation is parallel and resistance of the memory cell is increased to a second value R+ΔR if the magnetization orientation is changed from parallel to anti-parallel. The magnetization orientation of a selected memory cell and, therefore, the logic state of the memory cell may be read by sensing the resistance state of the memory cell. The memory cells thus form a memory array of resistive cross points.

Applying a voltage to a selected memory cell and measuring a sense current that flows through the memory cell one may sense the resistance state. Ideally, the resistance would be proportional to the sense current.

Sensing the resistance state of a single memory cell in an array, however, can be unreliable. All memory cells in the array are coupled together through many parallel paths. The resistance seen at one cross points equals the resistance of the memory cell at that cross point in parallel with resistances of memory cells in the other rows and columns of the array.

Moreover, if the memory cell being sensed has a different resistance due to the stored magnetization, a small differential voltage may develop. This small differential voltage can give raise to a parasitic current, which is also known as leakage current. The parasitic or leakage current becomes large in a large array and, therefore, can obscure the sense current. Consequently, the parasitic current can prevent the resistance from being sensed.

Unreliability in sensing the resistance state is compounded by many factoring variations, variations in operating temperatures, and aging of the MRAM devices. These factors can cause the average value or resistance in the memory cell to vary.

The prior art has attempted to reduce leakage current through various designs. One approach involves adding a unidirectional element, such as a diode, to limit the current path in one direction. FIG. 1 illustrates such an embodiment. A MRAM device 1 comprises several rows 2 (bit lines) and columns 3 (word lines) which form an array having several cross points 4. At each cross point 4 a memory cell 5 is provided. Further, at each cross point 4, a diode 6 being connected to the memory cell 5 is provided. The memory cell 5, together with the diode 6, forms a conductive path between one row 2 and one column 3. The diode 6 limits current flow in one direction.

In order to achieve low leakage currents, the quality of the diodes 6 must be very high. However, high quality diodes are difficult to produce. In particular diodes being manufactured using polysilicon deposition processes are known as leaky diodes.

Accordingly, there is a need to provide a MRAM storage device having isolation diodes which show only a very small leakage current.

SUMMARY

According to one embodiment of the present invention, a MRAM storage device comprises a substrate on/above of which a plurality of word lines, a plurality of bit lines, a plurality of memory cells, and a plurality of vertical access devices are provided. Each memory cell forms a resistive cross point of one word line and one bit line, respectively. Further, each memory cell is connected to one vertical access device such that a unidirectional conductive path is formed from a word line to a bit line via the corresponding memory cell (and via the respective diode), respectively. The substrate, at least a part of the word lines or at least a part of the bit lines, (at least parts of) the vertical access device are realized as one common monocrystal semiconductor block.

"Vertical access device" means any device that is arranged such that the direction of the current flow passing through the access device is vertical. In one embodiment, the vertical access device is an isolation diode. However, other access devices like vertical MOS devices (the gate being a ring around the pillar), JFETs (Junction FET), bipolar transistors or thyristors, Schottky diodes etc., could be used. For sake of simplicity, in the following description, the invention is discussed by way of example, the vertical access device being an isolation diode. However, the invention is not restricted to this example.

In one embodiment of the invention, the isolation diodes are not separately formed on a substrate using deposition processes, but formed within a monocrystal semiconductor wafer ("integrated" into the monocrystal semiconductor wafer). This means that a first part of a structured wafer constitutes the substrate, second parts of the structured wafer constitute the isolation diodes, and third parts of a structured wafer constitute word lines or bit lines. Since the quality of monocrystal semiconductor devices are very high, leakage currents can be prevented very effectively.

In one embodiment, each memory cell together with its corresponding isolation diode form a pillar extending perpendicular to the directions of the word lines and the bit lines. An upper part of each pillar may be constituted by the memory cell, and a lower part of each pillar may be constituted by the isolation diode.

In one embodiment, the word lines comprise both read word lines and write word lines. Each memory cell together with its corresponding isolation diode may form a pillar extending perpendicular to the directions of the word lines and the bit lines, wherein the pillars are provided on the read word lines. An upper part of each pillar may be constituted by a memory cell, and a lower part of each pillar may be constituted by an isolation diode, wherein the isolation diodes contact the read word lines.

The write word lines may show different horizontal positions than the read word lines, and overlapping vertical positions with respect to the vertical positions of the memory cells, so that each memory cell is sandwiched by two write word lines being electrically isolated from the memory cells.

The write word lines may also be located above the memory cells and show different horizontal positions than the read word lines. Alternatively, the write word lines may be located above the memory cells and show the same horizontal positions than the read word lines.

In a further embodiment, additional read word lines that show different horizontal positions than the read word lines, and that show overlapping vertical positions with respect to the vertical positions of the memory cells may be provided, so that each memory cell is sandwiched by two read word lines.

The conductive types of respective semiconductor regions may be chosen such that junctions between the substrate and read word lines being provided on the substrate from diodes, respectively. Those diodes serve to isolate the read word lines (which are realized as semiconductor regions) from the substrate.

One embodiment of the invention further provides a method for fabricating a MRAM storage device.

The method includes, implanting a laminated structure into a part of a monocrystal semiconductor wafer of a first conductive type, said laminated structure comprising a bottom layer of a second conductive type, a middle layer of the second conductive type and a top layer of the first conductive type, structuring the laminated structure at least to a depth corresponding to the bottom of the bottom layer to partition the laminated structure into a plurality of parallel stripes extending in a first horizontal direction, and structuring the stripes at least to a depth corresponding to the bottom of the middle layer to partition each stripe into a plurality of vertically extending pillars, each pillar comprising a part of the top layer and a part of the middle layer, wherein each junction between a part of the top layer and a part of the middle layer within a pillar constitutes one of the isolating diodes.

The spaces between the pillars may be filled with an isolating material.

Then the memory cells may be provided onto the isolating diodes. Further, word lines/bit lines may be provided on/adjacent to/above the memory cells.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts. The conductive types of all semiconductor areas in all embodiments may be inversed.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the following description, making reference to FIGS. 2–4, one embodiment of the MRAM storage device fabricating method according to the present invention will be given.

Figure 2:
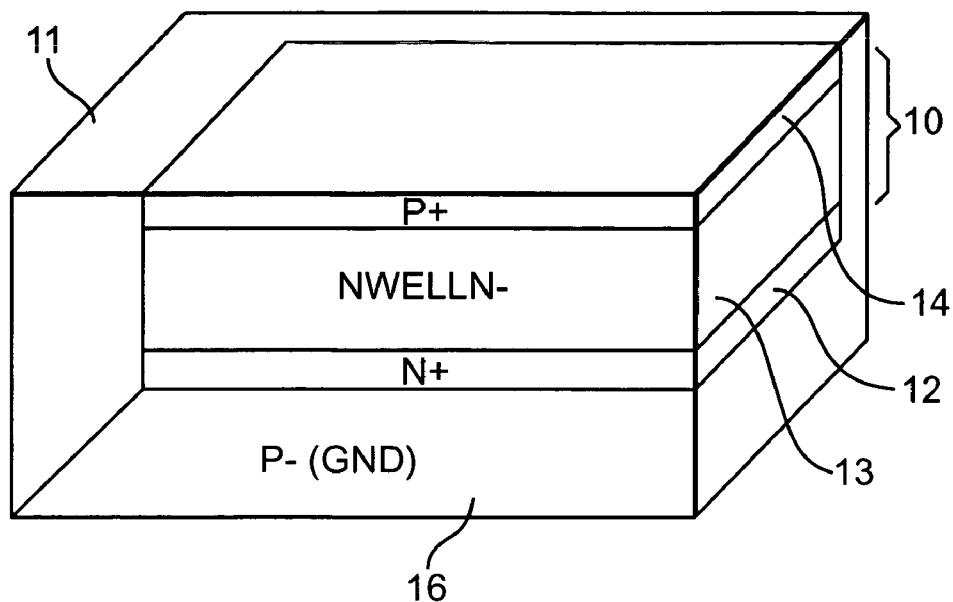
FIG. 2 illustrates a first production step of a MRAM storage device fabricating method according to the present invention.

As it is illustrated in FIG. 2, a laminated structure 10 is implanted into a part of a monocrystal semiconductor wafer 11 of a first conductive type. The laminated structure 10 comprises a bottom layer 12 ($n^+$-type), a middle layer 13 ($n^-$-type), and a top layer 14 ($p^+$-type). The semiconductor wafer 11 is of the $p^-$-type. The laminated structure 10 may for example be generated by respective doping processes.

Figure 3:
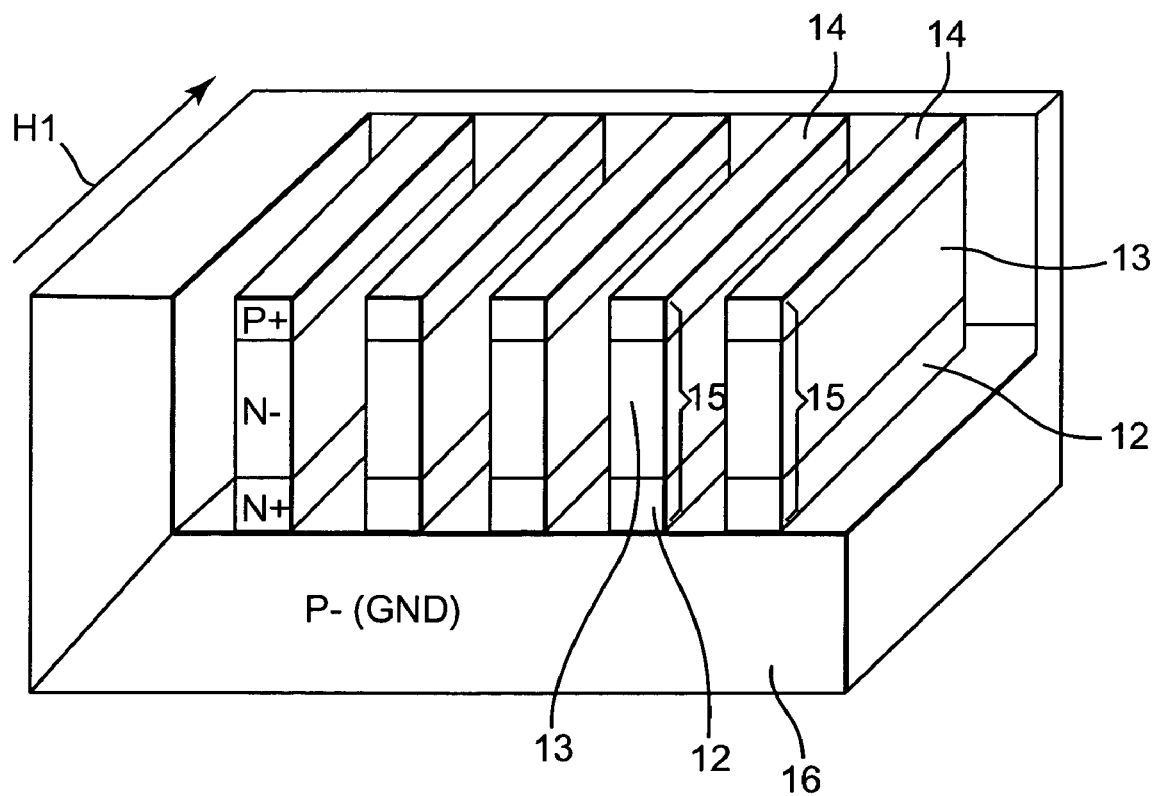
FIG. 3 illustrates a second production step of a MRAM storage device fabricating method according to the present invention.

Then, as illustrated in FIG. 3, the laminated structure 10 is structured by using for example etching processes such that a plurality of parallel stripes 15 are obtained, which extend in a first horizontal direction, H1, respectively. The structuring depth is chosen such that resulting trench depths between the parallel stripes 15 reach to at least the vertical position of the bottom of the bottom layer 12 (the lower surface of the bottom layer 12), so that the parallel stripes 15 are only connected via a substrate 16 (the remaining part of the semiconductor wafer 11 below the laminated structure 10) with each other.

Figure 4:
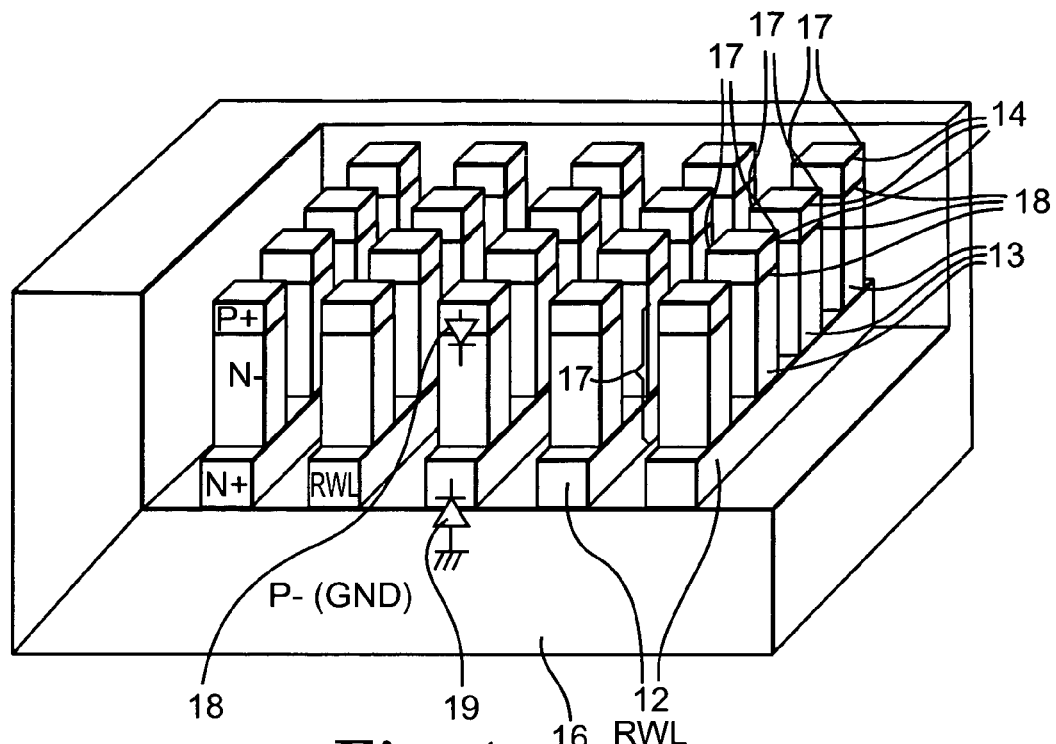
FIG. 4 illustrates a fourth production step of a MRAM storage device fabricating method according to the present invention.

Then, as illustrated in FIG. 4, the parallel stripes 15 are structured at least to a depth corresponding to the bottom of the middle layer 13 (the upper surface of the bottom layer 12) to partition each stripe 15 into a plurality of vertically extending pillars 17, wherein each pillar 17 comprises a part of the top layer 14 and a part of the middle layer 13, and wherein each junction 18 between the corresponding part of the top layer 14 and the corresponding part of the middle layer 13 within one pillar 17 constitutes one isolating diode.

The space between the pillars 17/between stripes RWL (read word lines) of the bottom layer 12 which extend in the first horizontal direction HI may be filled with a suitable material, for instance with an insulating material.

The insulating diodes formed at each junction 18 within the pillars 17 are monocrystal semiconductor diodes that show good properties with respect to leakage current prevention and can be fabricated very accurately since available methods for structuring monocrystal semiconductor blocks are very accurate. The remaining stripes of the bottom layer 12 are used as read word lines and are isolated from the substrate 16 since a junction 19 between the bottom of the stripes of the bottom layer 12 and the upper surface of the substrate 16 forms an isolating diode. It can be said that the substrate 16, the read word lines RWL as well as the isolation diodes (pillars 17) are realized as one common monocrystal semiconductor block (parts of the original wafer 11).

The arrangement illustrated in FIG. 4 serves as a "basis" of the embodiments of an MRAM storage device according to the embodiment of the present invention illustrated in FIGS. 5–8.

Figure 5:
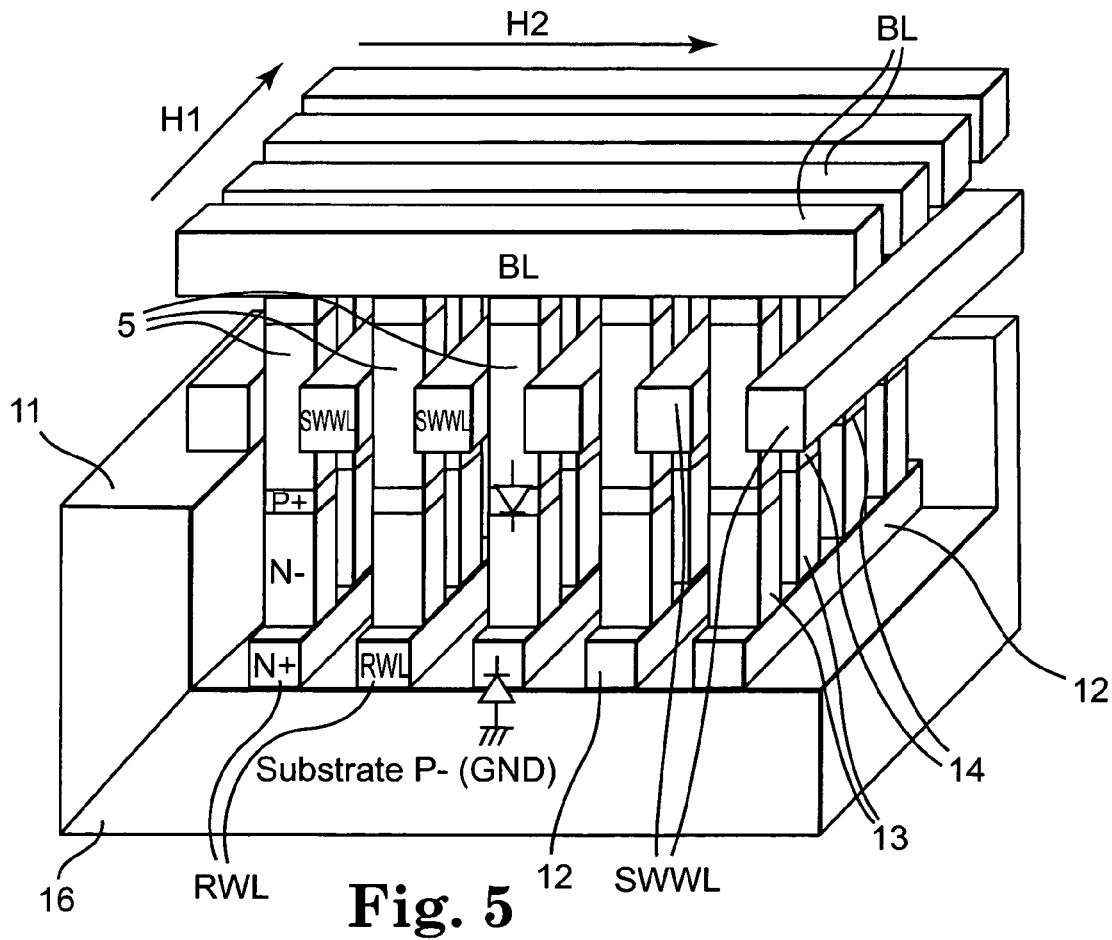
FIG. 5 illustrates a first embodiment of a MRAM storage device according to the present invention.

In FIG. 5, several memory cells 5 are provided, wherein each memory cell 5 shows a pillar-like form. A lower surface of the memory cell 5 contacts an upper surface of the top layer 14 of each isulating diode (pillar 17). An upper surface of each memory cell 5 contacts a bit line BL, said the bit lines BL extending along a second horizontal direction H2 which is perpendicular to the first horizontal direction H1. Each memory cell 5 constitutes, together with its corresponding isolation diode (pillar 17) a common pillar extending perpendicular to the directions of the word lines and the bit lines, wherein the pillars are located on the read word lines RWL. That is, an upper part of each common pillar is constituted by the memory cell 5, and a lower part of each pillar is constituted by the isolation diode (pillar 17), wherein the isolation diodes (pillars 17) contact the read word lines RWL.

In FIG. 5, also write word lines SWWL are shown having different horizontal positions than the read word lines RWL, and having overlapping vertical positions with respect to the vertical positions of the memory cells 5, so that each memory cell 5 is sandwiched by two write word lines SWWL being electrically isolated from the memory cells 5.

Figure 6:
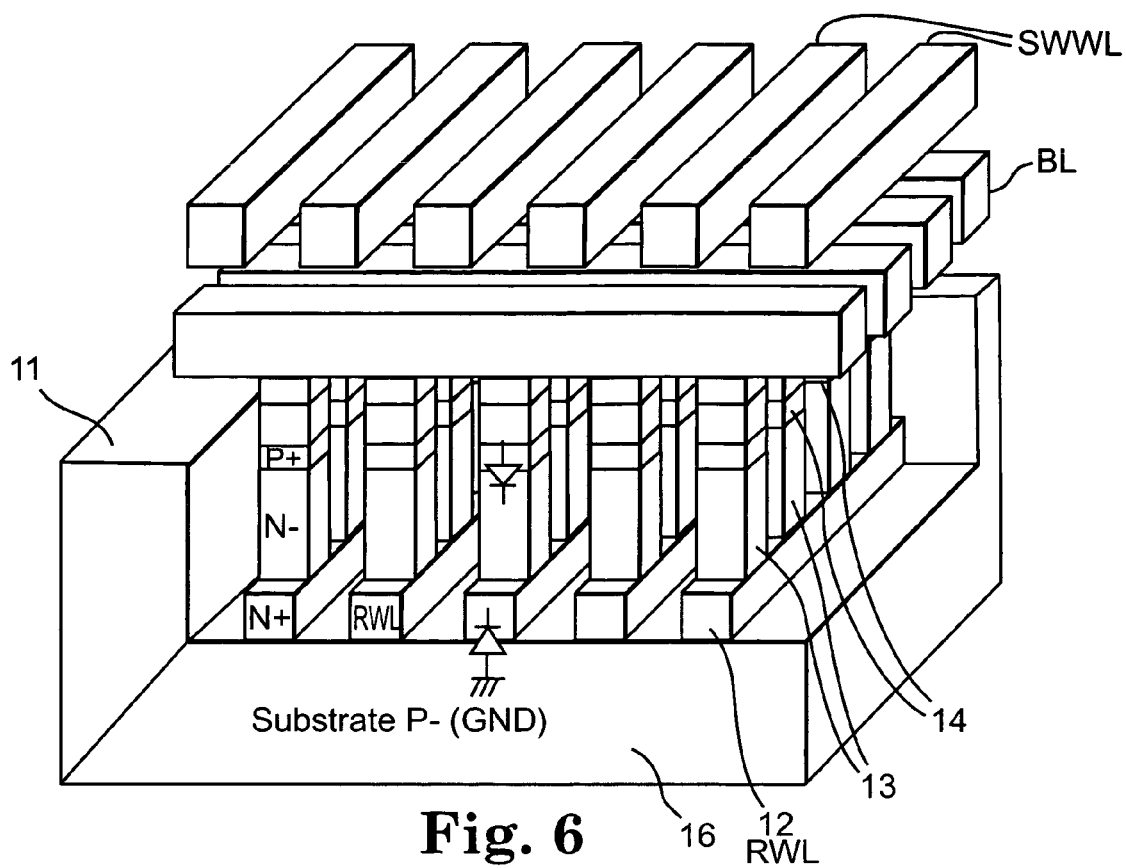
FIG. 6 illustrates a second embodiment of a MRAM storage device according to the present invention.

As illustrated in FIG. 6, the write word lines SWWL may also be located above the memory cells 5 as well as above the bit lines BL and show horizontal positions being different from that of the read word lines RWL.

Figure 7:
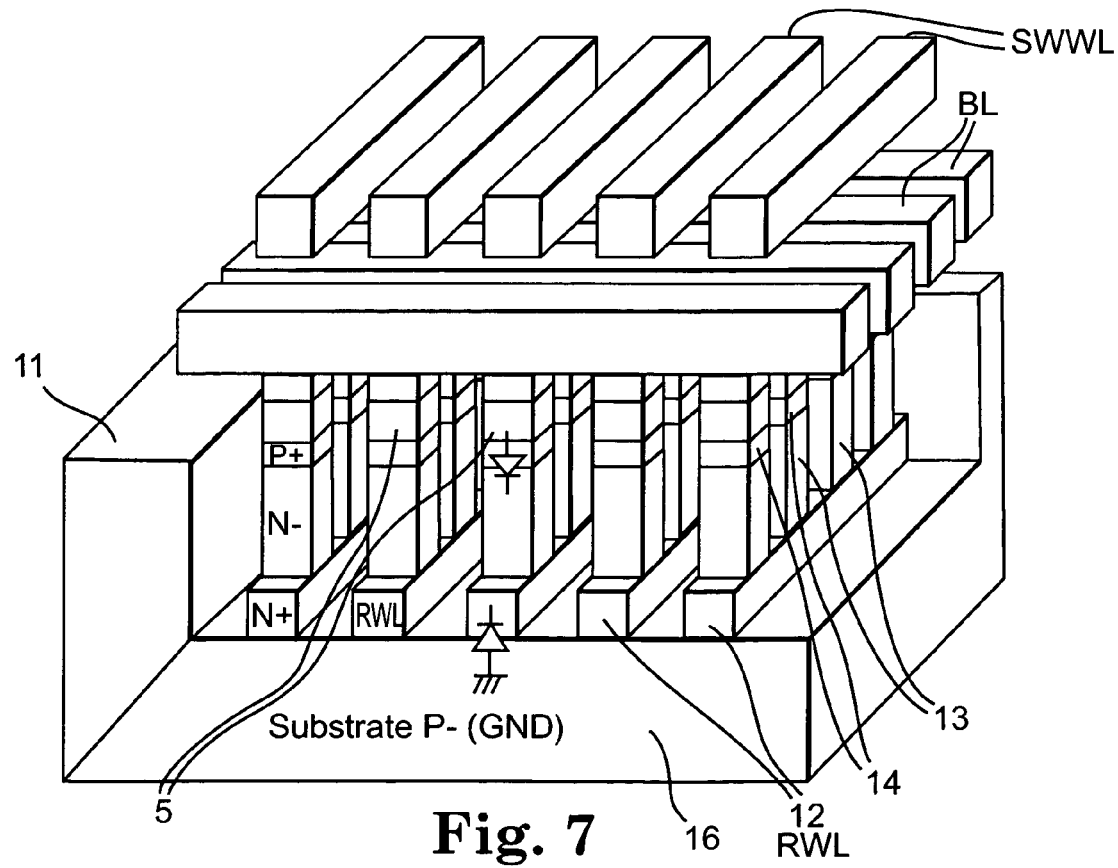
FIG. 7 illustrates a third embodiment of a MRAM storage device according to the present invention.

Alternatively, the horizontal positions of the write word lines SWWL may be identical to the horizontal positions of the read word lines RWL as illustrated in FIG. 7.

The use of the write word lines results from the fact that the resistance of the read word lines RWL is relatively high. Therefore, in order to read the magnetization state of one memory cell 5, the read word lines RWL are used, whereas the write word lines SWWL are used to write magnetization states into the memory cells 5, that is, to change their magnetization state. To change the magnetization state of a memory cell 5, a current flows through the write word lines SWWL, thereby generating a magnetic field. The magnetic fields of the two write word lines SWWL sandwiching a respective memory cell 5 are used to change the magnetization state of said memory cell 5. The use of two different kinds of word lines reduces the power consumption of the MRAM device, since the electrical resistance of the write word lines SWWL is low compared to that of the read word lines RWL.

Figure 8:
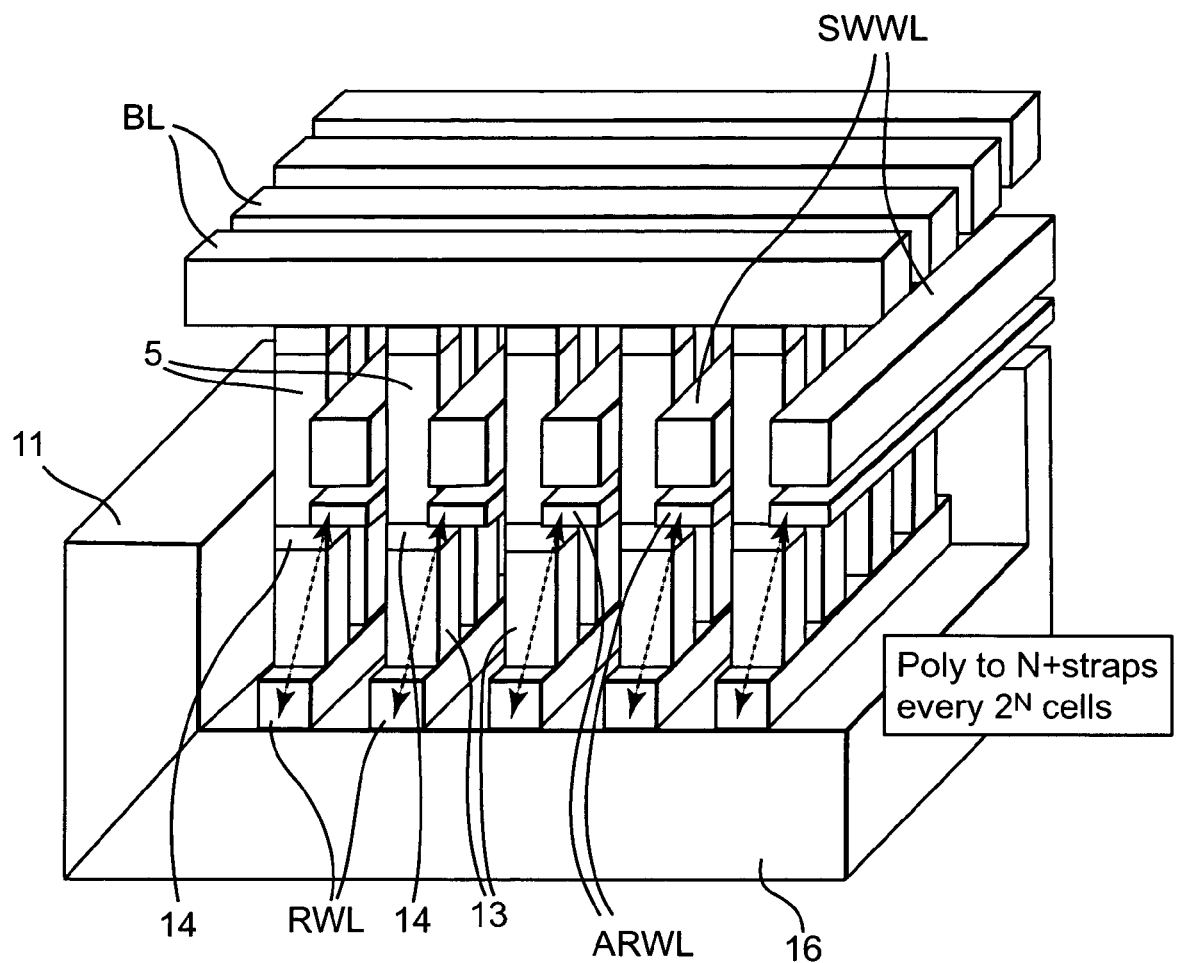
FIG. 8 illustrates a fourth embodiment of a MRAM storage device according to the present invention.

FIG. 8 illustrates a very similar arrangement compared to that of FIG. 5. The only difference is that additional read word lines ARWL are used that show different horizontal positions than that of the read word lines RWL. Further, the additional read word lines ARWL show overlapping vertical positions with respect to the vertical positions of the memory cells 5, so that each memory cell is sandwiched by two additional write word lines being electrically connected to the memory cells. Each memory cell 5 may be electrically connected to one or two ARWLs, respectively. The material of the ARWLs may, for example, consist of dope silocon. The use of additional read word lines ARWL reduces the power consumption of the MRAM storage device.

In the following description, further aspects of the invention will be discussed.

As has become apparent, the present invention describes how to build a $4F^2$ MRAM cell that includes a diode integrated into the silicon substrate.

A MRAM memory cell can be divided into two parts: a) a diode which can be considered as the select device as it allows the selection of a particular memory cell within the memory cell matrix by applying appropriate voltage levels on row control wires and column control wires, and b) a memory cell (MTJ) that is placed on top of the diode. The present invention describes a possibility to realize the diode as well as the memory cell on a very small area.

Figure 1:
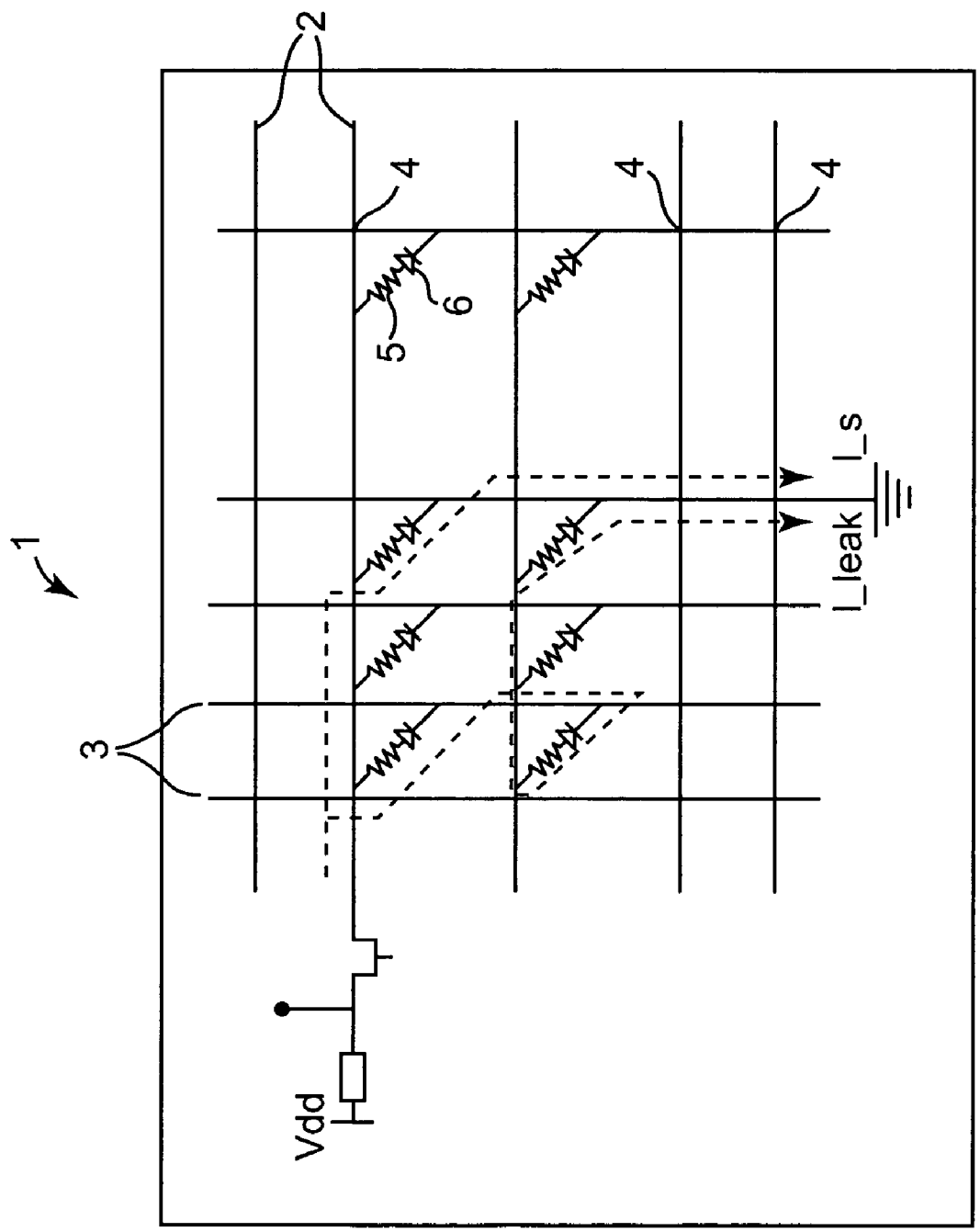
FIG. 1 illustrates a schematic drawing of a MRAM storage device according to the prior art.

The circuit of FIG. 1 illustrates diodes to prevent leakage currents ($I_{leak}$) and improve signal/noise ratios. In order to fully suppress $I_{leak}$, two conditions must be fulfilled:

a) All diodes, except the selected one has to be set into a forward polarization mode. This means that all unselected rows must have an applied voltage as low as possible and must have a positive voltage in order to backward bias all the unselected diodes. The selected row should have an applied positive voltage that remains lower than the voltage on unselected columns, and the selected column must have a voltage lower than the voltage of the selected row in order to forward bias the (unique) selected diode.

b) The diodes must not leak when being polarized in a backward mode.

If conditions a) and b) are fulfilled, the current that flows from a row driver to a column sink will have a maximum signal/noise ratio depending only of the parasitic elements along the corresponding conductive path and the information that is stored into the MTJ (memory cell).

Known MRAM storage devices (see for instance document U.S. 2003/0185038) show layout structures that include memory cells (MTJ) and diodes over metallizations. However, in order to produce such MRAM storage devices, diodes have to be built using polysilicon deposition processes, which means that very leaky diode devices are produced which do not fulfil condition b). The efficiency of storing/writing processes may be very moderate since leakage effects of several thousands of diodes could influence the read/write signal.

As illustrated in FIG. 2, a $p^+$ layer has been implanted on the top and of a wafer, and a deep $n^+$ layer has been implanted at the bottom. These two implants are standard processes in CMOS technology as they are needed to build p-channel transistors and to prevent latch-up.

A mask is used to define stripes and then to edge the silicon material of the wafer down to the substrate as illustrated in FIG. 3. A second mask defines stripes being perpendicular to the first stripes, and the silicon is etched down to the $n^+$ layer, which results in the arrangement illustrated in FIG. 4.

Empty volumes are filled with an insulator such as silicon dioxide, for example. The insulating filling may be done twice, after each etching process. Alternatively, the insulator filling can be down in one step, after the second etching process. This depends on the capability to properly deposit insulator material.

As illustrated in FIG. 4, a matrix of pillars is the result, said pillars being connected together in rows by the $n^+$ remaining stripes (RWL) at the bottom of the structure. Each of the pillars constitutes a $p^+/n^-$ diode made from the silicon substrate (monocrystal). The electrical characteristics of this diodes are as good as any (parasitic) diode which "automatically" exists within each p-channel semiconductor device.

When appropriate voltages (positive) are applied, the parasitic diode between the $n^+$ stripes and the grounded substrate is always backward polarized and is actually a parasitic capacitor with no effect on the functionality other than introducing propagation delays. As a consequence, the $n^+$-stripes can be used as read word lines by the MTJ array.

At best, the diode array dimensions are one active pitch in each direction. In other words, the diode area with isolation can be as small as $4F^2$.

In the following, three possible examples of integrations of an MTJ device (memory cell) over the newly defined diode structure are discussed. These examples are not limitative with respect to the present invention and other MTJ approaches such as rotational switching for instance can be used as well.

In all examples no polysilicon is needed as there is no transistor in the cell and as polysilicon is too resistive to carry the currents needed to program the memory cell.

In one embodiment, splitted write word lines on metal level (SWWL) are used. The memory cells (MTJ) are built over the metal and will need a self-aligned "deep wire" to keep the minimum 2F width on the row direction assuming that the metal rules are compatible which is normally the case. That is, the deep wire under the MTJ can be patterned by using the metal of the splitted write word lines as a mask.

The bit lines are connected to the MTJs and are extending along the perpendicular direction in the second metal layer. The column direction pitch can be limited to one metal pitch, and if the rules of this metal layer are good enough, the 2F size can be reached as well as on the row direction.

The dimensions of the first example (FIG. 5) can be realized as small as $4F^2$, using deep wire and the proposed diode production process.

As illustrated in FIG. 6, splitted write word lines are used, wherein the bit lines are still connected to the memory cells (MTJs) underneath the SWWL. One advantage of this embodiment is that there is no need for a deep wire, and the diode and the MTJ can be etched at the same time (assuming it is possible to properly etch the silicon and the metallic elements of the MTJ during the same process steps). The production process is apparently simpler than that of the first example, but the SWWLs are much more away from the MTJ, which means a loss in efficiency during the write operations. The dimension considerations are the same as above. In this embodiment, there are less constraints due to the absence of a deep wire (buried wire).

The example illustrated in FIG. 6 is similar to the second example except for the write word lines that use the standard mechanism (directly on top of the MTJ). As far as efficiency and the conclusions about dimensions are concerned, the same considerations as above apply.

As the buried $n^+$ layer may be resistive and thanks to the fact that polysilicon remains unused and thus available, the electrical properties of the RWL can be easily improved by adding a poly strap to the $n^+$-RWL, as indicated in FIG. 8.

The method for manufacturing the array of diodes as disclosed in the present invention is compatible with several processes for manufacturing memory cells (MTJ). Another feature of this manufacturing process is that the new "cross point" cell does not have any electrical path between bit lines and write word lines. An immediate consequence is that there are no ohmic losses through the entire MTJ array during the write operations. This will allow much larger matrices and thus more efficient circuit efficiencies.

The process complexity is limited to two metal layers and thus all the layers from active to the last metal could have pitches limited to 2F (as on DRAM dedicated processes) and ensure a true $4F^2$ area for the memory cell.

Other devices than a diode could be used as access devices, as long as they are vertical to keep all the cell density. Similar array arrangements could be done with vertical MOS devices (the gate being a ring around the pillar), JFETs, bipolar transistors or thyristors, Schottky diodes etc.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. MRAM storage device comprising:
a substrate;
a plurality of word lines;
a plurality of bit lines;
a plurality of memory cells; and
a plurality of vertical access devices;
wherein each memory cell forms a resistive cross point of one word line and one bit line, respectively;
wherein each memory cell is connected to one vertical access device such that a unidirectional conductive path is formed from a word line to a bit line via the corresponding memory cell, respectively; and
wherein the substrate, at least a part of the word lines and at least a part of the vertical access device are realized as one common monocrystal semiconductor block.

2. The MRAM storage device of claim 1, wherein each memory cell together with its corresponding vertical access device constitutes a pillar extending perpendicular to the directions of the word lines and the bit lines.

3. The MRAM storage device of claim 2, wherein an upper part of each pillar is constituted by the memory cell, and a lower part of each pillar is constituted by the vertical access device.

4. The MRAM storage device of claim 1, wherein the word lines comprise read word lines and write word lines.

5. The MRAM storage device of claim 4, wherein each memory cell together with its corresponding vertical access device constitutes a pillar extending perpendicular to the directions of the word lines and the bit lines, wherein the pillars are provided on the read word lines.

6. The MRAM storage device of claim 5, wherein an upper part of each pillar is constituted by the memory cell, and a lower part of each pillar is constituted by the vertical access device, wherein the vertical access devices contact the read word lines.

7. The MRAM storage device of claim 4, wherein the write word lines show different horizontal positions than the read word lines, and that the write word lines show overlapping vertical positions with respect to the vertical positions of the memory cells, so that each memory cell is sandwiched by two write word lines being electrically isolated from the memory cells.

8. The MRAM storage device of claim 4, wherein the write word lines are located above the memory cells and show different horizontal positions than the read word lines.

9. The MRAM storage device of claim 4, wherein the write word lines are located above the memory cells and show the same horizontal positions than the read word lines.

10. The MRAM storage device of claim 4, wherein additional read word lines which show different horizontal positions than the read word lines, and which show overlapping vertical positions with respect to the vertical positions of the memory cells, so that each memory cell is sandwiched by two write word lines being electrically connected to the memory cells.

11. The MRAM storage device of claim 4, wherein junctions between the substrate and read word lines are directly provided onto the substrate in the form of diodes, respectively.

12. The MRAM storage device of claim 1, wherein said vertical access device is an isolation diode.

13. MRAM storage device comprising:
a substrate;
a plurality of word lines;
a plurality of bit lines;
a plurality of memory cells; and
a plurality of vertical access devices;
wherein each memory cell forms a resistive cross point of one word line and one bit line, respectively;
wherein each memory cell is connected to one vertical access device such that a unidirectional conductive path is formed from a word line to a bit line via the corresponding memory cell, respectively; and
wherein the substrate, at least a part of the bit lines and at least a part of the vertical access device are realized as one common monocrystal semiconductor block.

14. An MRAM storage device comprising:
a substrate;
a plurality of word lines above the substrate;
a plurality of bit lines over the substrate;
a plurality of memory cells over the substrate; and
a plurality of vertical access devices over the substrate;
wherein each memory cell forms a resistive cross point of one word line and one bit line;
wherein each memory cell is connected to one vertical access device such that a unidirectional conductive path is formed from a word line to a bit line via the corresponding memory cell; and
wherein the substrate, at least part of the word lines, at least part of the bit lines and at least part of the vertical access devices are all one common monocrystal semiconductor block.

15. The MRAM storage device of claim 14, wherein each memory cell together with its corresponding vertical access device constitutes a pillar extending perpendicular to the directions of the word lines and the bit lines.

16. The MRAM storage device of claim 15, wherein an upper part of each pillar is constituted by the memory cell, and a lower part of each pillar is constituted by the vertical access device.

17. The MRAM storage device of claim 14, wherein the word lines comprise read word lines and write word lines.

18. The MRAM storage device of claim 17, wherein each memory cell together with its corresponding vertical access device constitutes a pillar extending perpendicular to the directions of the word lines and the bit lines, wherein the pillars are provided on the read word lines.

* * * * *